United States Patent [19]

O et al.

[11] Patent Number: 6,041,081
[45] Date of Patent: Mar. 21, 2000

[54] CDMA TRANSMITTER HAVING A VARIABLE GAIN CIRCUIT INSERTED BETWEEN A TRANSMITTER MIXER AND A TRANSMITTER ANTENNA

[75] Inventors: Waho O; Tsutomu Katsuyama, both of Tokyo, Japan

[73] Assignee: Oki Electric Industry Co., Ltd., Tokyo, Japan

[21] Appl. No.: 08/820,994

[22] Filed: Mar. 19, 1997

[30] Foreign Application Priority Data

Mar. 26, 1996 [JP] Japan .................................. 8-069900

[51] Int. Cl.⁷ .................................................. H04L 25/03
[52] U.S. Cl. .......................... 375/297; 455/116; 455/126
[58] Field of Search .................................. 375/295, 296, 375/297, 345, 200, 208, 202, 206, 201, 346, 367, 216; 370/342, 335, 203, 208, 320; 455/240.1, 250.1, 249.1, 422, 571, 126, 127, 115, 116, 69, 234.1, 232.1, 117, 522, 517, 507, 575, 103, 129, 245.1, 67.1, 553, 552, 93, 226.2, 226.1, 239.1; 330/279, 278, 129, 284, 134, 141, 149, 281, 138, 207, 250, 285, 295, 280, 124 R, 133, 136, 151, 144, 296, 254; 340/825.69

[56] References Cited

U.S. PATENT DOCUMENTS 5,103,459   4/1992   Gilhousen et al. .......................... 375/1
5,396,516   3/1995   Padovani et al. ........................ 375/225
5,504,773   4/1996   Padovani et al. ........................ 375/200
5,604,730   2/1997   Tiedemann, Jr. ........................ 370/252

OTHER PUBLICATIONS

M. Leonar, "Digital Cellular System in the U.S., CDMA and TDMA are competing," Nikkei Electronics, No. 579, Jan. 1993, Nikkei BP, Inc., Tokyo, pp. 163–175.

Ballot Version, "Mobile Station–Base Station Compatibility Standard for Dual–Model Wideband Spread Spectrum Cellular System" TIA/EIA Interim Standard, Jul. 1993.

*Primary Examiner*—William Luther
*Attorney, Agent, or Firm*—Venable; Robert J. Frank; Michael A. Sartori

[57] ABSTRACT

A CDMA transmitter having a variable gain circuit inserted between a transmitter mixer and a transmitter antenna. The gain is controlled in response to the RF output power so that the spurious emission level at the maximum RF output power and that at output power reduced by a predetermined amount can be both satisfied. This makes it possible to increase the degree of freedom of choosing circuit components in the RF stage.

11 Claims, 8 Drawing Sheets

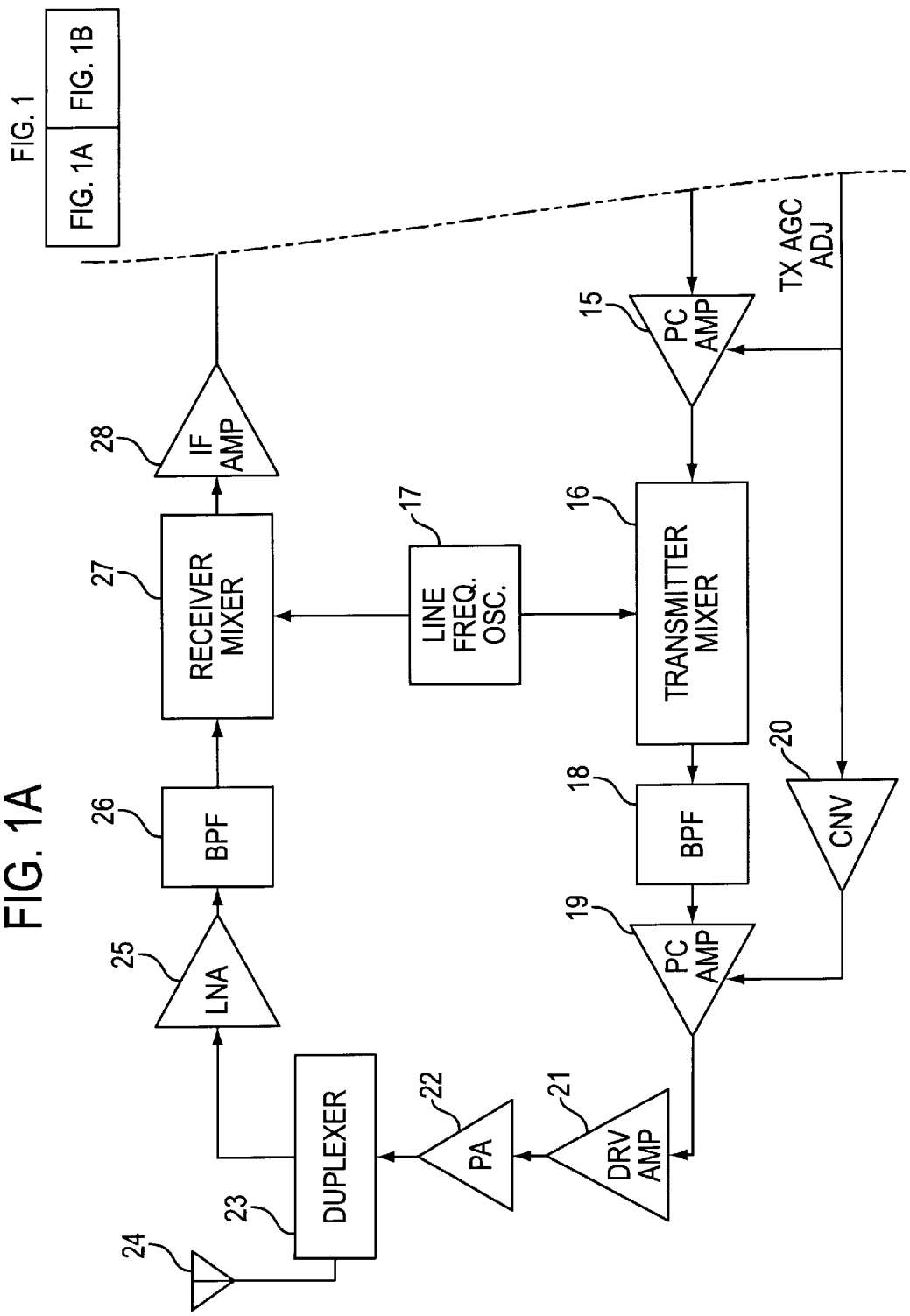

FIG. 2
(PRIOR ART)
MAXIMUM RF OUTPUT POWER RANGES

| CLASS | MAXIMUM RF OUTPUT POWER (LOWER LIMIT) | MAXIMUM RF OUTPUT POWER (UPPER LIMIT) |
|---|---|---|
| I | 1dBW (1.25 WATTS) | 8dBW (6.3 WATTS) |
| II | -3dBW (0.5 WATT) | 4dBW (2.5 WATTS) |
| III | -7dBW (0.2 WATT) | 0dBW (1.0 WATT) |

FIG. 3
(PRIOR ART)

LIMITATIONS ON SPURIOUS EMISSION LEVELS
AT MAXIMUM RF OUTPUT POWER

| OFFSET FROM CARRIER FREQUENCY fc | MAXIMUM ALLOWABLE SPURIOUS EMISSION LEVEL |
|---|---|
| OUTSIDE 900kHz | -40dBc/30kHz |
| OUTSIDE 1.98MHz | -54dBc/30kHz |

FIG. 5
(PRIOR ART)

LIMITATIONS ON CONDUCTED SPURIOUS EMISSIONS
(WHEN RF OUTPUT POWER IS -13 dBm)

| OFFSET FROM CARRIER FREQUENCY | OUTSIDE 900kHz FOR 30kHz BANDWIDTH, AND OUTSIDE 1.385MHz FOR 1MHz BANDWIDTH | OUTSIDE 1.98MHz FOR 30kHz BANDWIDTH, AND OUTSIDE 2.465MHz FOR 1MHz BANDWIDTH |
|---|---|---|
| MAXIMUM ALLOWABLE SPURIOUS EMISSION LEVEL SELECT ONE OF (a), AND COMBINATION OF (b) AND (c) | (a) -42dBc/30kHz | (a) -54dBc/30kHz |
| | (b) -60dBm/30kHz | (b) -60dBm/30kHz |
| | (c) -55dBm/MHz | (c) -55dBm/MHz |

CDMA TRANSMITTER HAVING A VARIABLE GAIN CIRCUIT INSERTED BETWEEN A TRANSMITTER MIXER AND A TRANSMITTER ANTENNA

BACKGROUND OF THE INVENTION

1. Field of the Invention

The present invention relates to a CDMA (code division multiple access) transmitter, which is advantageously applicable to a CDMA system according to the TIA/EIA/IS-95 standard predominant in North America.

2. Description of the Background Art

The total number of subscribers of the cellular system in the United States reached 34,000,000 at the end of 1995, and is expected to keep a double figure growth rate every year. Accordingly, it is expected that the analog systems cannot meet the demand, and hence digital cellular systems with superior frequency availability have been investigated to be carried out in practice. Since Qualcomm Incorporated has disclosed the CDMA system, it has attracted a great deal of attention as a system achieving large capacity. In this respect, reference is made to M. Leonar, "Digital Cellular System in the U.S., CDMA and TDMA are competing", Nikkei Electronics, January 1993, Nikkei BP Inc., Tokyo. The CDMA system spreads the frequency bandwidth of a transmitted signal to 1.25 MHz using a spread spectrum scheme, and carries out fine transmission power control. It is expected to implement a large capacity system by employing diversity effects and soft handoff.

Thus, portable telephone manufacturers have been developing the CDMA cellular systems to meet the demand of the digital cellular. The portable telephone systems under development now are CDMA/AMPS dual mode cellular systems in accordance with the TIA/EIA/IS-95 standard in the U.S., considering that the analog cellular systems (AMPS) and CDMA cellular systems will coexist for some time from now on. In this respect, reference is also made to "TIA/EIA/ INTERIM STANDARD: Mobile station—base station compatibility standard for dual-mode wideband spread spectrum cellular system" TIA/EIA/IS-95, July 1993.

The CDMA transmitters of the conventional systems, however, have a problem in that they must meet severe demands on components like a transmitting mixer, such as low noise figure NF, high gain G and low nonlinear distortion ratio k to satisfy the standard. This presents a problem in the selection and development of the components, and has a great influence on the cost and characteristics like dissipated current of the system.

SUMMARY OF THE INVENTION

It is therefore an object of the present invention to provide a CDMA transmitter which can facilitate the selection and development of its components.

According to one aspect of the present invention, there is provided a CDMA (code division multiple access) transmitter in which limitations on a spurious emission level at maximum RF (radio frequency) output power are less severe than limitations on a spurious emission level at RF output power smaller than the maximum RF output power by a predetermined amount, the CDMA transmitter comprising: a transmitter mixer for mixing a signal to be transmitted with a local oscillation signal; a transmitter antenna for radiating a signal to be transmitted; and a variable gain circuit inserted between the transmitter mixer and the transmitter antenna for controlling gain in response to RF output power.

Here, the CDMA transmitter may further comprise: a detecting circuit for detecting power of a received signal; a difference circuit for obtaining a difference between the power of a received signal and a predetermined power reference; a generator for generating a power control signal from the difference; and a control circuit for controlling the gain of the variable gain circuit in response to the power control signal.

The variable gain circuit may comprise one of a variable gain amplifier, a variable attenuator, and a combination of a variable gain amplifier and a variable attenuator.

The CDMA transmitter may further comprise a bandpass filter connected to an output of the transmitting mixer, tha bandpass filter having an output connected to the variable gain circuit.

The CDMA transmitter may further comprise a power control amplifier connected to an input side of the transmitter mixer.

The CDMA transmitter may further comprise means for sharing gain between the variable gain circuit and the power control amplifier.

According to the present invention, it is possible to satisfy both the limitations on the spurious emission level at the maximum RF output power and the limitations on a spurious emission level at the RF output power smaller than the maximum RF output power at the same time. In addition, it is also possible to increase the degree of freedom of choosing circuit components in the RF stage, which facilitates selection of the components.

BRIEF DESCRIPTION OF THE DRAWINGS

The objects and features of the present invention will become more apparent from consideration of the following detailed description taken in conjunction with the accompanying drawings in which:

FIG. 1 shows a combination fo FIGS. 1A and 1B;

FIGS. 1A and 1B, when combined as shown in FIG. 1, are a schematic block diagram showing a preferred embodiment of a transmitter and receiver including a CDMA transmitter in accordance with the present invention;

FIG. 2 shows a table showing ranges of maximum RF output power associated with the embodiment shown in FIGS. 1A and 1B;

FIG. 3 is a table showing limitations on spurious emissions at the maximum RF output power in the embodiment;

FIG. 5 is also a table showing limitations on conducted spurious emissions;

DESCRIPTION OF THE PREFERRED EMBODIMENT

The invention will now be described with reference to the accompanying drawings. Before describing the details of an embodiment, limitations on spurious emissions of a CDMA transmitter in the dual-mode cellular system according to the TIA/EIA/IS-95 will be described with some problems involved in the limitations.

The limitations on spurious emissions are provided for preventing the transmitted signal of a transmitter from effecting on other radio equipment, and are defined in terms of two items, maximum RF output power and conducted spurious emissions.

FIGS. 2 and 3 show the limitations on the spurious emissions in terms of the maximum RF output power, wherein FIG. 2 illustrates allowed ranges of the maximum RF output power, and FIG. 3 illustrates allowed spurious levels at the maximum RF output power.

Figure 4:
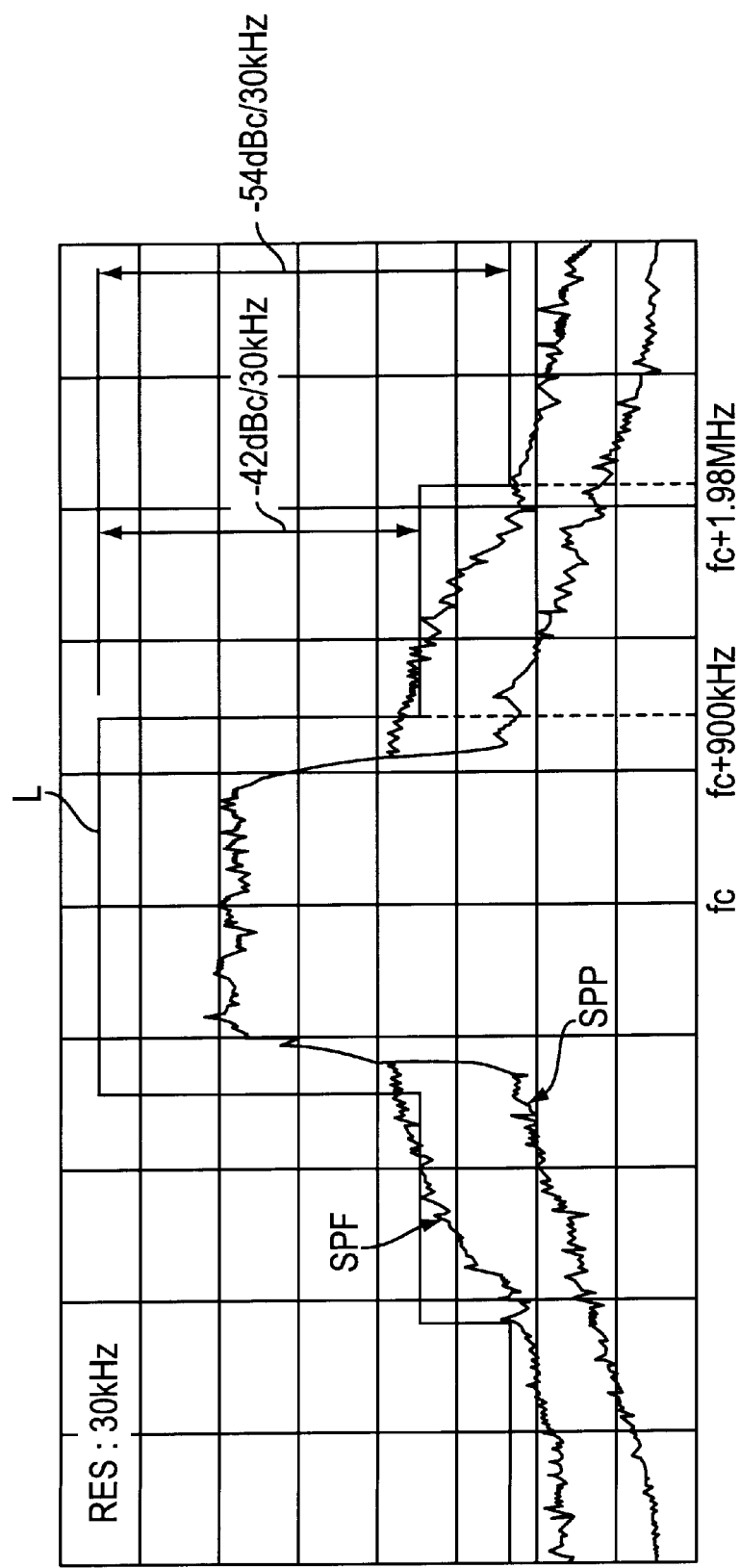
FIG. 4 is a diagram plotting limitations on spurious emissions at the maximum RF output power in the embodiment.

The ranges of the maximum RF output power are provided for three classes divided in accordance with the maximum RF output power of a mobile station. These are satisfied if the RF output power is present between the upper and lower limits. Furthermore, the spectrum of the transmitted signal at the maximum RF output power is provided as illustrated in FIG. 3. As shown in FIG. 3, the spurious level of the transmitted signal must not exceed a level of −42 dBc/30 kHz outside the region of ±900 kHz from the transmission carrier frequency fc, and a level of −54 dBc/30 kHz outside the region of ±1.98 MHz from the transmission carrier frequency fc. The limitations can be expressed by a stepwise limit line L which is symmetric with respect to the vertical line representing the carrier frequency fc in FIG. 4. FIG. 4 shows two spectra SPP and SPF of transmitted signals of two transmitting systems. Rises outside the spread signal bandwidth of 1.23 MHz around the frequency fc in the spectra are due to the nonlinearity of the circuit devices consisting of the transmitting systems. An increase in the distortion of the transmitting system due to its components may result in a spectrum such as SPF which does not satisfy the limitations.

FIG. 5 illustrates the limitations on the spurious emissions provided in terms of the conducted spurious emissions. As shown in FIG. 5, the conducted spurious emissions are prescribed when the RF output power is −13 dBm rather than when it is maximum. Accordingly, to estimate the transmitting system in terms of the conducted spurious emissions, it is necessary to vary the gain of a power control amplifier for the AGC in response to the changes in the received signal power or in accordance with autonomous regulation (by an open or closed loop control function) of the system so that the RF output power at an antenna terminal is set at −13 dBm. After that, the spectrum of the transmitted signal radiated from the antenna terminal is analyzed.

The conducted spurious emissions are provided in two limitations, mild one (a) and severe one (b) and (c). Since the severe limitations (b) and (c) can meet the mild limitations (a), it is intended to fulfill the severe limitations (b) and (c) from now on.

Figure 6:
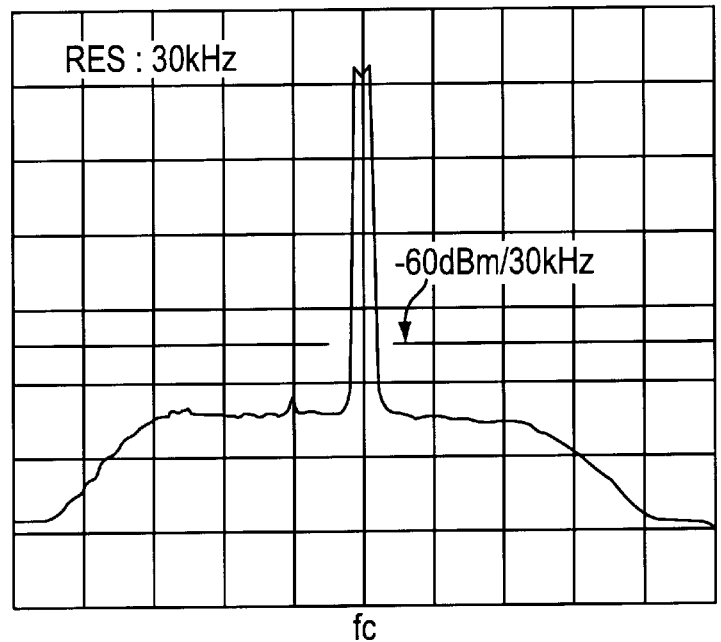
FIG. 6 plots a spectrum useful for understanding the limitations on the conducted spurious emissions.
Figure 7:
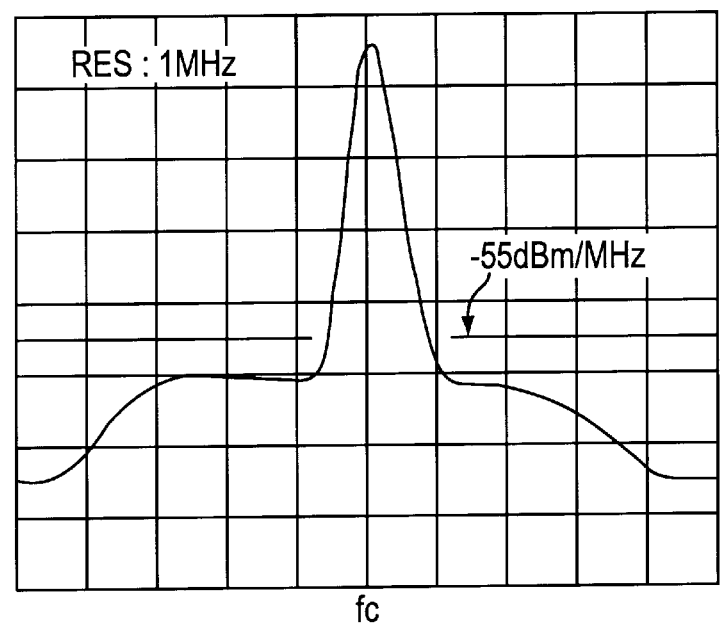
FIG. 7 plots a spectrum useful for understanding the limitations on the conducted spurious emissions.

FIG. 6 illustrates a limit line (−60 dBm/30 kHz) of the spurious levels in terms of 30 kHz bandwidth, which provides the spurious levels of line spectra like local carrier leakage from a transmitting mixer. FIG. 7, on the other hand, illustrates a limit line (−55 dBm/1 MHz) of the spurious levels in terms of 1 MHz bandwidth, which provides the spurious levels of wideband signal spectra like a noise level N of spectra in the transmission band.

The severe limitations on the spurious emissions by the TIA/EIA/IS-95 standard provides the CDMA transmitter with a difficult problem in selecting and developing the electronics constituting the transmitter. The performance of the electronics is chiefly estimated in terms of three features, the noise figure NF, gain G and nonlinear distortion ratio k. The reason for the difficulty will be described.

(1) First, there is a possibility that although the demand on the maximum RF output power as shown in FIG. 2 may be fulfilled, the limitations on the spurious of the transmission spectrum as shown in FIG. 3 cannot be satisfied. This will be described in more detail.

The transmitted signal (RF signal) of the CDMA transmitter has a high carrier frequency such as 800 MHz, and a wide bandwidth such as 1.23 MHz because of a spread spectrum function. The stage for processing the RF signal with such a high frequency and wide bandwidth, that is, the stage from the transmitting mixer to the antenna terminal is designed to have a constant gain.

If the constant gain is set at a small value, the input signal level to the transmitting mixer must be increased to satisfy the demand on the maximum RF output power, which means that the input signal levels to the components following the transmitting mixer are also increased.

If the input level exceeds a particular value of each of the components, the nonlinear distortion ratio k will be degraded because the signal enters the nonlinear amplification domain, resulting in the distortion in the output signal. This will hinder the spurious of the transmitted spectrum from being fulfilled.

(2) Second, there is a possibility that the transmission noise level at the antenna terminal cannot satisfy the limitations on the conducted spurious emissions as shown in FIGS. 5 and 6, when the constant gain is increased. This will also be described in more detail.

To satisfy the limitations on the maximum RF output power, it will be possible to increase the constant gain from the transmitting mixer to the antenna terminal instead of increasing the input signal level to the transmitting mixer, and to use components with a low nonlinear distortion ratio k.

The increased constant gain, however, will amplify the line spectra like local carrier leakage caused by the transmitting mixer, and this will hinder the limitations on the conducted spurious emissions as shown in FIGS. 5 and 6 from being satisfied. In addition, the line spectra will have adverse effect on the transmission noise level at the antenna terminal.

The transmission noise level at the antenna terminal is proportional to the noise figure NF and the gain of the transmitting mixer and a driver amplifier for driving the power amplifier rather than to the line spectra. There is thus a possibility that the limitations on the conducted spurious emissions as shown in FIGS. 5 and 6 cannot be satisfied because the increased gain will augment the transmission noise level at the antenna terminal.

(3) As a result, it is very difficult to select parts of the transmitting mixer.

It is necessary to select components with a small noise figure NF, and with small intermediate frequency leakage and local carrier leakage to satisfy the limitations on the conducted spurious emissions due to the local carrier leakage (line spectra) and the transmission noise level. Furthermore, considering the selection of the components of the stages following the transmitting mixer, it is necessary for the transmitting mixer to have large conversion gain G and a small nonlinear distortion ratio k.

The large conversion gain G, however, will hinder the limitations on the conducted spurious emissions from being satisfied on the same reason as described in (2) above. In this case, it is necessary to reduce the gain of the transmitting mixer and the following stages to fulfill the limitations, in which case there is a possibility that the limitations on the maximum RF output power cannot be satisfied.

In contrast with this, a small conversion gain G of the transmitting mixer will satisfy the limitations on the conducted spurious emissions. In this case, however, the gain of the stages after the transmitting mixer must be increased, in which there is a possibility that the limitations on the spurious emissions at the maximum RF output power as shown in FIG. 3 cannot be satisfied owing to the nonlinear distortion ratio k of the individual components. Furthermore, since the output signal level of the transmitting mixer depends on its nonlinear distortion characteristics, the mixer can output only a small level signal if the nonlinear distortion ratio k is large, that is, if the conversion gain G of the mixer is small, in which case the gain after the mixer must be increased. As a result, there is a possibility that the limitations on the spurious emissions at the maximum RF output power as shown in FIG. 3 cannot be satisfied owing to the nonlinear distortion ratio k of individual components. An embodiment of the CDMA transmitter in accordance with the present invention will now be described which is applied to the CDMA transmission portion of a dual-mode cellular system to solve these problems.

Figure 1B:
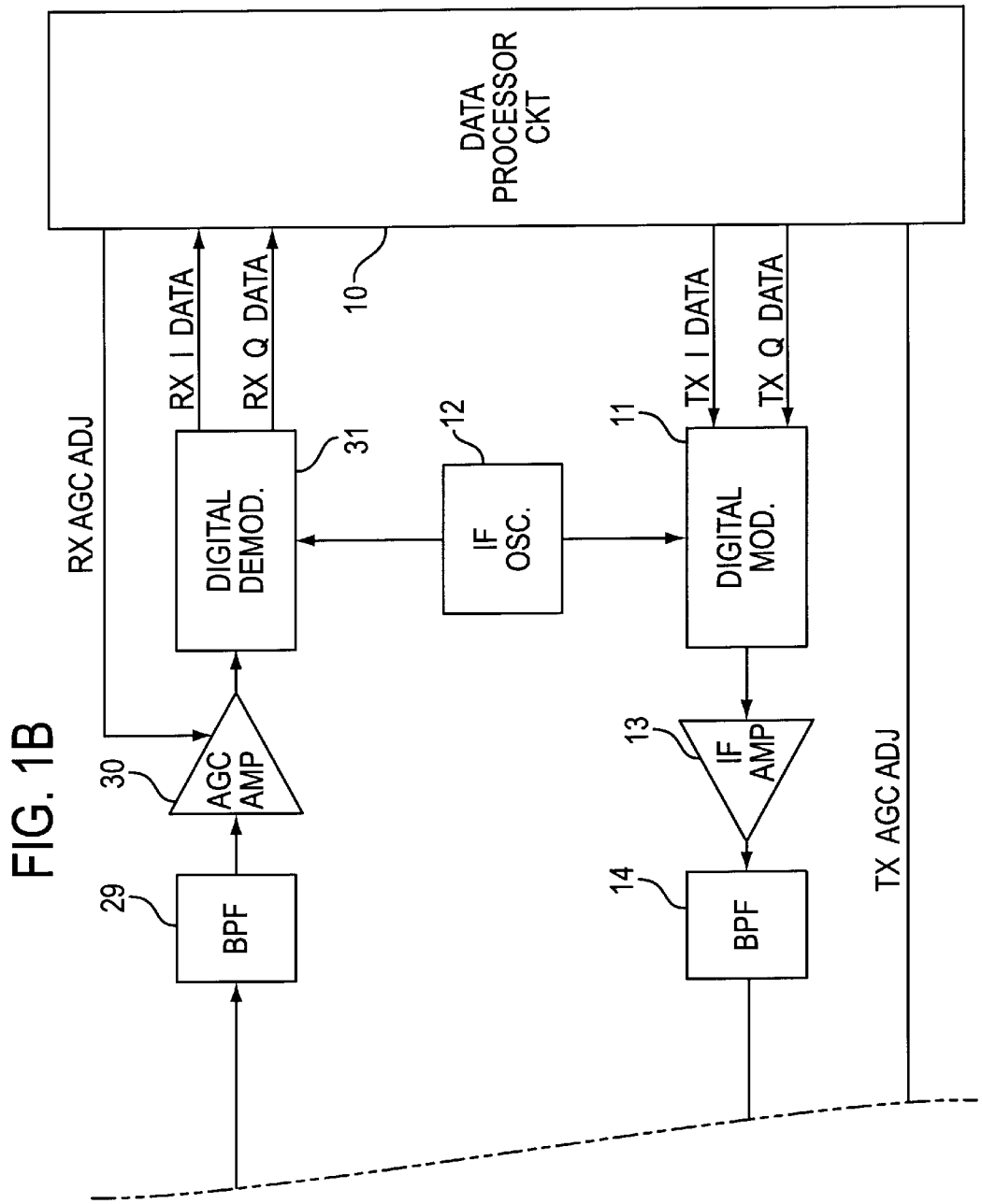

FIGS. 1A and 1B form, when combined as shown in FIG. 1, a schematic block diagram showing a transmitter and receiver of the preferred embodiment of the invention. First, the transmitting system will be described. In FIG. 1, a data processor circuit 10 provides a digital modulator 11 consisting of a quadrature modulator with a transmitted signal consisting of an I-phase data signal TX I DATA and a Q-phase data signal TX Q DATA, which have undergone the spread spectrum processing. The digital modulator 11 carries out the digital modulation of a local oscillation signal of an intermediated frequency fed from an intermediate frequency (IF) oscillator 12 in response to the quadrature data signals TX I Data and TX Q DATA. The digital modulation signal (QPSK signal) is amplified by an intermediate frequency amplifier (IF AMP) 13 by a fixed gain, is passed through a bandpass filter (BPF) 14 to remove unnecessary frequency components, and is supplied to a power control amplifier (PC AMP) 15.

Figure 8:
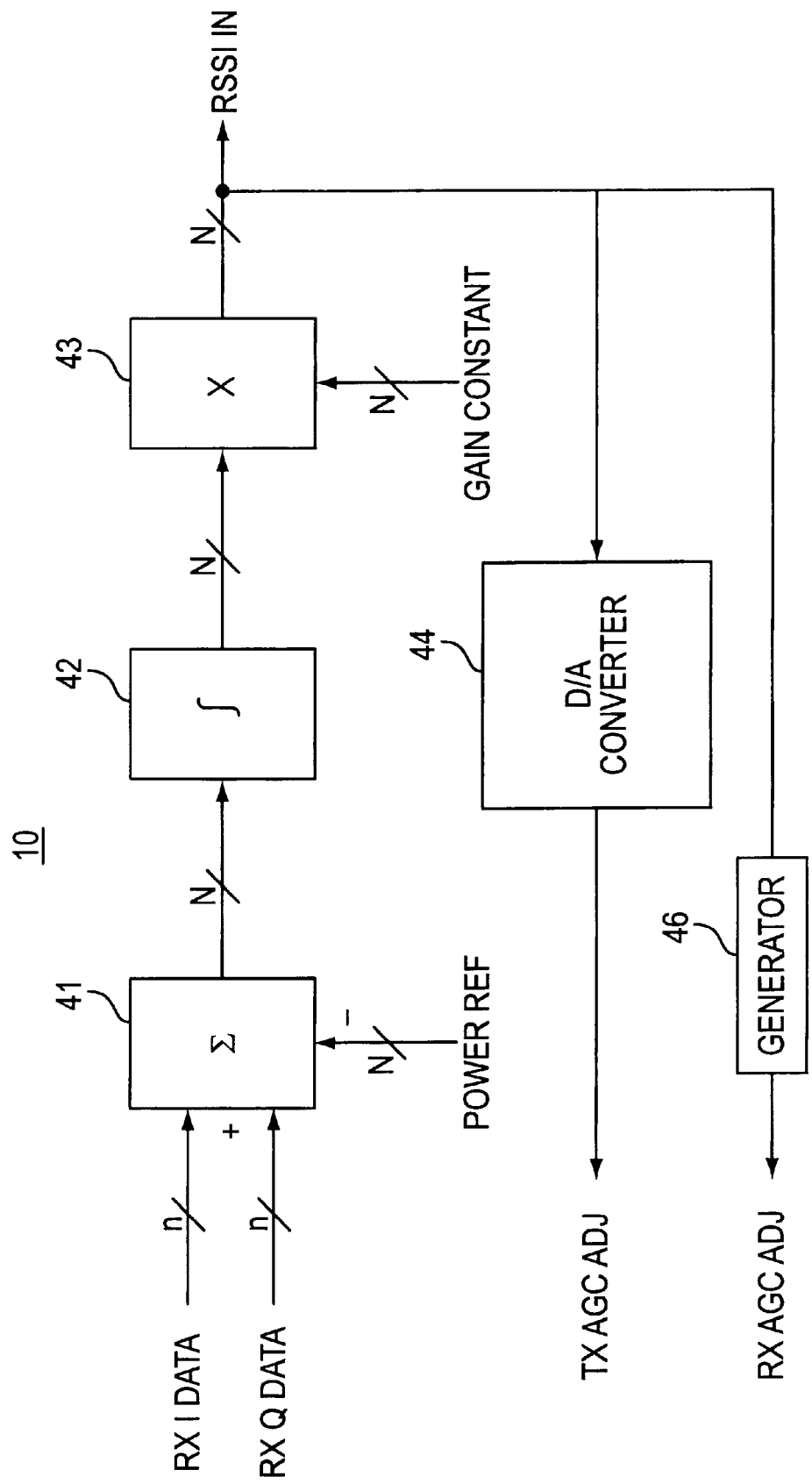
FIG. 8 is a schematic block diagram showing a portion of the data processor circuit for generating a gain adjusting signal to be supplied to the power control amplifier and the signal converter included in the illustrative embodiment shown in FIGS. 1A and 1B.

The power control amplifier 15 is provided with a gain adjusting signal TX AGC ADJ from a portion described below in conjunction with FIG. 8 so that it amplifies the input digital modulation signal by a gain determined by the adjusting signal TX AGC ADJ, and supplies its output to a transmitter mixer 16. The foregoing configuration of the intermediate frequency signal (IF signal) processing system may be the same as that of a conventional system.

The transmitter mixer 16 is supplied with a local oscillation signal of a transmission line frequency from a line frequency oscillator 17 so that it upconverts the digital modulation signal in the intermediate frequency band to that in the transmission frequency band. The thus upconverted digital modulation signal (transmitted signal: RF signal) is passed through a bandpass filter 18 to remove unnecessary frequency components, and is supplied to the power control amplifier 19.

The power control amplifier 19 is provided through a signal converter 20 with the adjusting signal TX AGC ADJ output from the data processor circuit 10, and amplified the input RF signal by the gain determined by the gain adjusting signal output from the signal converter 20, thereby supplying the output to a driver amplifier 21 which drives a power amplifier (PA) 22. The RF signal which has been power amplified through the driver amplifier 21 and the power amplifier 22 is fed to a transmitter and receiver antenna through a duplexer 23 to be radiated to the space.

The system of the instant embodiment primarily differs from the conventional system in that it comprises the power control amplifier 19 and the signal converter 20 in the processing system of the transmitted signal (RF signal) with the above-mentioned transmission frequency. The new components 19 and 20 function such that the limitations on the spurious emissions at the maximum RF output power and the limitations on the conducted spurious emissions according to the TIA/EIA/IS-95 are both satisfied. The reason for this will be described later.

Conventionally, a CDMA transmitter having a power control amplifier in the RF stage has not been proposed because the carrier frequency of the RF stage is as high as about 800 MHz, and the transmission AGC is more easily carried out in the IF stage with a lower frequency.

Next, the receiving system will be described. The radio wave captured by the transmitter and receiver antenna 24 is transduced into an electric signal (received signal) by the antenna in connection with the duplexer 23 to be supplied to the LNA (low noise amplifier) 25. The received signal amplified by the LNA 25 by a fixed gain is passed through a BPF 26 to eliminate unnecessary frequency components, and is down-converted to a digital modulation signal in the intermediate frequency band (IF signal) by a receiver mixer 27 which is adapted to mix the received signal with a local oscillation signal of the transmission line frequency fed from the line frequency oscillator 17. The IF signal is in turn amplified by an intermediate frequency amplifier (IF AMP) 28, and is fed to an automatic gain control amplifier (AGC AMP) 30 after band limited by a bandpass filter (BPF) 29.

The automatic gain control amplifier 30 is provided with a gain adjusting signal RX AGC ADJ from the data processing circuit 10 so that it amplifies the received signal (QPSK signal) which has been converted into the intermediate frequency band by the gain indicated by the gain adjusting signal RX AGC ADJ. A digital demodulator 31, using the local oscillation signal of the intermediate frequency fed from the intermediate frequency oscillator 12, carries out the quadrature detection of the digital modulation signal to produce a baseband signal consisting of an I-phase data signal RX I DATA and a Q-phase data signal RX Q DATA, and supplies them to the data processor circuit 10. The data processing circuit 10 despreads the input signal, followed by decision of the code sequences of the received signal.

Next, referring to FIG. 8, the internal configuration of the data processor circuit 10 will be described which generates the gain adjusting signal TX AGC ADJ fed to the power control amplifier 15 and the signal converter 20. In FIG. 8, the I-phase data signal RX I DATA and the Q-phase data signal RX Q DATA are fed to a summation circuit 41. The summation circuit 41 is also provided with a power reference signal (a reference signal in the receiving AGC loop) POWER REF, and it outputs a difference signal between the power reference signal POWER REF and the sum signal of the I-phase data signal RX I DATA and the Q-phase data signal RX Q DATA. The difference signal is integrated by an integrator 42 corresponding to an AGC loop filter, and the resultant integrated signal is multiplied by a gain signal GAIN CONSTANT corresponding to the AGC loop gain by a multiplier 43. Thus, a received field intensity signal RSSI IN is generated which is proportional to the average received field intensity of a desired signal at the antenna terminal 24, and it is supplied to a generator 46 adapted to generate the gain adjusting signal RX AGC ADJ, and a digital-to-analog (D/A) converter 44. The D/A converter 44 D/A converts the received field intensity signal RSSI IN to an analog signal, thereby generating the gain adjusting signal TX AGC ADJ for the AGC of the transmitting system.

Next, the reason will be described why the power control amplifier 19 and the signal converter 20 operate such that they satisfy the limitations on the spurious emissions in terms of the maximum RF output power and the limitations on the conducted spurious emissions according to the TIA/EIA/IS-95. The inventors of the present patent application achieve the present embodiment considering that the spectrum spurious emission levels (b) and (c), FIG. 5, in terms of the conducted RF output power differ from that in terms of the maximum spurious emissions in the TIA/EIA/IS-95.

The spectrum spurious emission levels (b) and (c), FIG. 5, provided in terms of the conducted spurious emissions are severer than that in terms of the maximum RF output power. The former, however, is the one when the RF output power is −13 dBm at the antenna terminal. Accordingly, the power control amplifier 19 newly provided in the RF stage can satisfy the two limitations: It can satisfy the limitations on the maximum RF output power as shown in FIGS. 2 and 3 by increasing the gain of the power control amplifier 19 to its maximum; and the limitations on the conducted spurious emissions as shown in FIG. 5 by reducing the gain to a certain extent.

When designing the transmission system at the maximum RF output power, the nonlinear distortion ratio k and the gain of individual components are used as the key index of selecting the components so that the limitations on the maximum RF output power as shown in FIGS. 2 and 3 are satisfied. Although there are no specific limitations on the noise level and the local carrier leakage at the antenna terminal, which are generated owing to the noise figure of the transmitting mixer 16, it is enough that they are less than the spectrum spurious level as shown in FIG. 3. Accordingly, the transmitter mixer 16 with a reasonable noise figure NF and local carrier leakage can fulfill the limitations on the maximum RF output power. As a result, the nonlinear distortion ratio k and the gain can be used as the key index of choosing the components.

Furthermore, the addition of the power control amplifier 19 in the RF stage can reduce the output level of the transmitter mixer 16 by the amount corresponding to the gain of the power control amplifier 19 as compared with that of the conventional system. This means that the transmitter mixer 16 can be used which has a lower 1 dB compression point used as an index of a turning point to the saturation region. In other words, the transmitter mixer 16 can be employed with a nonlinear distortion ratio k larger than that of the conventional one.

Although the limitations on the maximum RF output power can be satisfied in this way, a difficulty would be expected to satisfy the limitations on the conducted spurious emissions. The limitations, however, are provided at the RF output power of −13 dBm, which can be satisfied by reducing the gain of the power control amplifier 19 in the RF stage by some amount from its maximum gain. This also makes it possible to reduce the noise level and the local carrier leakage level generated owing to the noise figure NF of the transmitting mixer 16.

Although the foregoing description is mainly directed to the transmitter mixer 16, which includes the components having lower characteristics than the conventional ones, and can satisfy the limitations, the remaining elements 21 and 22 in the RF stage can also satisfy the limitations with components having lower characteristics than the conventional ones.

The signal converter 20 mainly composed of an operational amplifier carries out the amplification, attenuation, shift or inversion of the gain adjusting signal (direct current signal) TX AGC ADJ in accordance with the gain control characteristics of the power control amplifier 19, and applies it to the gain control terminal of the power control amplifier 19. The signal converter 20 bears the role of adjusting the share of the gain control amount between the power control amplifier 19 and the power control amplifier 15 in the IF stage before the transmitting mixer 16, to satisfy not only the limitations on the spurious emissions in terms of the maximum RF output power and the limitations on the conducted spurious emissions, but also the limitations on the open loop power control characteristics (AGC characteristics). It is possible to generate the control signals of the power control amplifiers 15 and 19 by separate data processor circuits without using the signal converter 20.

The power control amplifier 15 in the IF stage fills the role of the AGC in the transmission system as in the conventional system.

According to the CDMA transmitter, that is, the transmission system in the CDMA mode of the dual-mode cellular system of the present embodiment, can offer the following advantages.

(1) It is possible to improve the spurious emission level at both the maximum RF output power and the reduced output power, even if the RF stages other than the power control amplifier 19 use components having the same characteristics as the conventional components. The characteristics include the noise figure NF, gain G and nonlinear distortion ratio k. In other words, even if the conventional configuration cannot satisfy the limitations on the maximum RF output power and conducted spurious emissions according to the TIA/EIA/IS-95 standard, the configuration of the illustrative embodiment using the same components can fulfill the limitations.

(2) Less severe design specifications are acceptable of the components of the transmitter mixer 16 and others. As a result, the term required for developing the components can be shortened, and their cost can be reduced. This leads to reducing the development term and cost of the entire CDMA transmitter.

(3) An 80 dB or more dynamic range is required of the open loop power control in the transmitter in the TIA/EIA/IS-95 standard. In the conventional system, the power control amplifier 15 in the IF stage alone controls the RF output power, and hence it must have a dynamic range not less than 80 dB. In contrast with this, since the illustrative embodiment shown and described above controls the RF output power with the two power control amplifiers 15 and 19 in the IF and RF stages, the dynamic ranges less than 80 dB are permitted to the individual amplifiers 15 and 19. In other words, the specifications of the power control amplifier 15 in the RF stage can be relaxed.

The invention is not understood as limited to the details of the illustrative embodiment of the CDMA transmitted, but the following variations can be implemented, for example.

(1) The present invention can be applied not only to the CDMA transmitter according to the TIA/EIA/IS-95, but also to CDMA transmitters, in which the spurious emission level at the maximum RF output power differs from that at the reduced output power, and the latter is severer, including an application of self-imposed restraint.

(2) The location of the power control amplifier 19 in the RF stage is not limited to that of the foregoing embodiment. It can be inserted at any place in the RF stage. For example, it can be connected to the output side of the driver amplifier 21.

(3) Although the variable gain of the RF stage is implemented with the power control amplifier 19 in the foregoing embodiment, the gain control for satisfying the limitations on the spurious emissions can be achieved by applying a variable gain amplifier to the driver amplifier 21 or the power amplifier 22.

(4) Although the power control amplifiers 15 and 19 are provided in the IF and RF stages, respectively, in the foregoing embodiment, the power control amplifier 15 in the IF stage can be omitted so that the power control amplifier 19 in the RF stage carries out both the power control in the AGC operation, and the power control for satisfying the limitations on the spurious emissions.

(5) The configuration for controlling the power control amplifiers 15 and 19 is not restricted to that of the foregoing embodiment. For example, the power control amplifier 15 in the IF stage may also be supplied with a gain adjusting signal through a signal converter in accordance with the gain sharing between the two amplifiers 15 and 19. Alternatively, the gain adjusting signal fed to the power control amplifier 15 in the IF stage may be generated separately from the gain adjusting signal fed to the power control amplifier 19 by the digital processing in the data processing circuit 10. In this case, the signal converter 20 can be removed.

(6) Although the variable gain means in the RF stage consists of the power control amplifier in the foregoing stage, it may be replaced by a variable attenuator, or a combination of a variable attenuator and a variable gain amplifier.

While the present invention has been described with reference to the particular illustrative embodiment, it is not to be restricted by the embodiment. It is to be appreciated that those skilled in the art can change or modify the embodiments without departing from the scope and spirit of the present invention.

What is claimed is:

1. A CDMA (code division multiple access) transmitter for transmitting a first signal at an RF (radio frequency) frequency under first limitations on a spurious emission level at a first RF output power and second limitations on a spurious emission level at a second RF output power smaller than the first RF output power by a predetermined amount, the first RF output power being a maximum RF output power of said transmitter, the second limitations being severer than the first limitations, said CDMA transmitter comprising:

a transmitter mixer for mixing a second signal to be transmitted with a local oscillation signal to produce the first signal at the RF frequency;

a transmitter antenna for radiating the first signal at the RF frequency;

a power control circuit having a variable first gain responsive to a power control signal for supplying said transmitter antenna with the first signal produced from said transmitter mixer and the first gain, the power control signal corresponding to an RF power level at which the first signal is to be radiated by said transmitter antenna; and a power control amplifier connected to an input side of said transmitter mixer and having a variable second gain responsive to the power control signal for amplifying the second signal with the second gain to provide said transmitter mixer with the amplified second signal;

said power control circuit varying the first gain in response to the power control signal so as to maximize the first gain based upon the power control signal.

2. The CDMA transmitter in accordance with claim 1, further comprising:

a receiver for receiving a third signal at the RF frequency;

a detecting circuit for detecting power of the third signal received;

a difference circuit for obtaining a difference between the power detected by said detecting circuit and a predetermined power reference; and a control signal generator for generating the power control signal from the difference.

3. The CDMA transmitter in accordance with claim 2, wherein said control signal generator generates the power control signal such that the power control signal is proportional to an average field intensity of the third signal.

4. The CDMA transmitter in accordance with claim 1, wherein said power control circuit comprises one of a variable gain amplifier having the variable first gain responsive to the power control signal, a variable attenuator having the variable first gain responsive to the power control signal, and a combination of the variable gain amplifier and the variable attenuator.

5. The CDMA transmitter in accordance with claim 1, wherein said transmitter is defined by a mobile station-base station compatibility standard, the second RF output power being a conducted RF output power of said transmitter.

6. The CDMA transmitter in accordance with claim 5, wherein the mobile station-base station compatibility standard is a July 1993 version of a TIA/EIA/IS-95 standard.

7. The CDMA transmitter in accordance with claim 1, further comprising means for sharing the first and second gains between said power control circuit and said power control amplifier responsive to the power control signal.

8. The CDMA transmitter in accordance with claim 2, wherein said power control circuit comprises one of a variable gain amplifier having the variable first gain responsive to the power control signal, a variable attenuator having the variable first gain responsive to the power control signal, and a combination of the variable gain amplifier and the variable attentuator.

9. The CDMA transmitter in accordance with claim 1, further comprising a bandpass filter connected to an output of said transmitter mixer for bandpass filtering the first signal produced from said transmitter mixer to said power control circuit.

10. A CDMA (code division multiple access) transmitter for transmitting a first signal at an RF (radio frequency) frequency under first limitations on a spurious emission level at a first RF output power and second limitations on a spurious emission level at a second RF output power smaller than the first RF output power by a predetermined amount, the first RF output power being a maximum RF output power of said transmitter, the second limitations being severer than the first limitations, said CDMA transmitter comprising:

means for mixing a second signal to be transmitted with a local oscillation signal to produce the first signal at the RF frequency;

means for radiating the first signal at the RF frequency;

means for supplying said means for radiating with the first signal having a variable first gain responsive to a power control signal, the power control signal corresponding to an RF power level at which the first signal is to be radiated by said means for radiating, the first signal produced from said means for mixing and the first gain; and means for amplifying the second signal with a variable second gain responsive to the power control signal and for supplying said means for mixing with the amplified second signal;

said means for supplying varying the first gain in response to the power control signal so as to maximize the first gain based upon the power control signal.

11. The CDMA transmitter in accordance with claim 4, wherein said power control circuit further comprises a signal converter for converting the power control signal to supply said one of the variable gain amplifier, the variable attenuator, and the combination of the variable gain amplifier and the variable attenuator with the converted power control signal.

* * * * *